(12) United States Patent
Yan et al.

(10) Patent No.: US 10,283,932 B2
(45) Date of Patent: *May 7, 2019

(54) THERMAL COMPENSATION FOR BURST-MODE LASER WAVELENGTH DRIFT

(71) Applicant: Futurewei Technologies, Inc., Plano, TX (US)

(72) Inventors: Xuejin Yan, Santa Clara, CA (US); Jianmin Gong, San Jose, CA (US); Hongbing Lei, San Jose, CA (US); Jianhe Gao, Wuhan (CN)

(73) Assignee: Futurewei Technologies, Inc., Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/356,241

(22) Filed: Nov. 18, 2016

(65) Prior Publication Data

US 2017/0070030 A1 Mar. 9, 2017

Related U.S. Application Data

(63) Continuation of application No. 14/969,610, filed on Dec. 15, 2015, now Pat. No. 9,537,287, which is a (Continued)

(51) Int. Cl.
*H01S 3/04* (2006.01)
*H01S 5/06* (2006.01)
(Continued)

(52) U.S. Cl.
CPC ........ *H01S 5/0612* (2013.01); *H01S 5/02453* (2013.01); *H01S 5/12* (2013.01);
(Continued)

(58) Field of Classification Search
CPC ...... H01S 5/0612; H01S 5/02453; H01S 5/12; H01S 5/2222; H01S 5/3211;
(Continued)

(56) References Cited

U.S. PATENT DOCUMENTS

| 5,262,658 A | * | 11/1993 | Jankowski | ............ H01L 27/153 257/467 |
| 5,536,085 A | * | 7/1996 | Li | .......................... H01S 5/4031 372/20 |

(Continued)

FOREIGN PATENT DOCUMENTS

| CN | 1957508 A | 5/2007 |
| CN | 101529675 A | 9/2009 |

(Continued)

OTHER PUBLICATIONS

Van Veen, D., et al., "Measurement and Mitigation of Wavelength Drift Due to Self-Heating of Tunable Burst-Mode DML for TWDM-PON," 2014, 3 pages.

(Continued)

*Primary Examiner* — Vu A Vu
(74) *Attorney, Agent, or Firm* — Conley Rose, P.C.

(57) ABSTRACT

An apparatus comprising a laser comprising an active layer and configured to emit an optical signal, wherein a temperature change of the laser causes the optical signal to shift in wavelength, and a heater thermally coupled to the active layer and configured to reduce a wavelength shift of the optical signal by applying heat to the active layer.

26 Claims, 12 Drawing Sheets

Related U.S. Application Data continuation-in-part of application No. 14/509,662, filed on Oct. 8, 2014, now Pat. No. 9,246,307.

(51) Int. Cl.
| | |
|---|---|
| *H01S 5/12* | (2006.01) |
| *H01S 5/323* | (2006.01) |
| *H01S 5/024* | (2006.01) |
| *H01S 5/22* | (2006.01) |
| *H01S 5/30* | (2006.01) |
| *H01S 5/32* | (2006.01) |
| H01S 5/026 | (2006.01) |
| H01S 5/062 | (2006.01) |
| H01S 5/227 | (2006.01) |

(52) U.S. Cl.
CPC .......... *H01S 5/2222* (2013.01); *H01S 5/3054* (2013.01); *H01S 5/323* (2013.01); *H01S 5/3211* (2013.01); *H01S 5/3235* (2013.01); *H01S 5/0261* (2013.01); *H01S 5/06216* (2013.01); *H01S 5/227* (2013.01); *H01S 2301/176* (2013.01)

(58) Field of Classification Search
CPC ...... H01S 5/3235; H01S 5/3054; H01S 5/323; H01S 2301/176; H01S 5/06216; H01S 5/227; H01S 5/0261
USPC .......................................................... 372/34
See application file for complete search history.

(56) References Cited

U.S. PATENT DOCUMENTS

| | | | |
|---|---|---|---|
| 5,615,224 A | 3/1997 | Cohen | |
| 5,663,975 A * | 9/1997 | Yoshida | H01S 5/4031 372/34 |
| 5,960,014 A | 9/1999 | Li et al. | |
| 6,342,997 B1 * | 1/2002 | Khadkikar | G01K 7/01 361/100 |
| 6,700,910 B1 | 3/2004 | Aoki et al. | |
| 6,703,666 B1 | 3/2004 | Huttemann et al. | |
| 7,224,708 B2 * | 5/2007 | Sin | H01S 5/0425 372/20 |
| 7,515,779 B2 * | 4/2009 | Ishikawa | H01S 5/0265 385/1 |
| 7,981,757 B2 | 7/2011 | Burke et al. | |
| 9,246,307 B1 | 1/2016 | Yan et al. | |
| 9,537,287 B2 * | 1/2017 | Yan | H01S 5/0612 |
| 2007/0060083 A1 | 3/2007 | Oh | |
| 2008/0063016 A1 | 3/2008 | Bhatia et al. | |
| 2009/0086206 A1 | 4/2009 | Mori | |
| 2009/0202196 A1 | 8/2009 | Kish et al. | |
| 2011/0090932 A1 | 4/2011 | Park et al. | |
| 2011/0134947 A1 | 6/2011 | Rahum et al. | |
| 2012/0230356 A1 | 9/2012 | Gokay | |
| 2013/0107900 A1 | 5/2013 | Hayakawa | |
| 2013/0343411 A1 | 12/2013 | Banno | |

FOREIGN PATENT DOCUMENTS

| | | |
|---|---|---|
| CN | 102545040 A | 7/2012 |
| CN | 103094831 A | 5/2013 |
| EP | 0683552 A2 | 5/1995 |
| JP | H05335669 A | 12/1993 |
| JP | H09237703 A | 9/1997 |
| JP | 2000101143 A | 4/2000 |
| JP | 2010503987 A | 2/2010 |
| JP | 2011530828 A | 12/2011 |
| JP | 2013098365 A | 5/2013 |
| JP | 2013207023 A | 10/2013 |
| RU | 2316864 C1 | 2/2008 |

OTHER PUBLICATIONS

Sakano, S., et al., "Tunable DFB Laser with a Striped Thin-Film Heater," IEEE Photonics Technology Letters, vol. 4, No. 4, Apr. 1992, pp. 321-323.
Notice of Allowance dated Sep. 24, 2015, 7 pages, U.S. Appl. No. 14/509,662, filed Oct. 8, 2014.
Office Action dated Mar. 24, 2015, 13 pages, U.S. Appl. No. 14/509,662, filed Oct. 8, 2014.
Office Action dated Feb. 5, 2015, 7 pages, U.S. Appl. No. 14/509,662, filed Oct. 8, 2014.
Office Action dated Jul. 16, 2015, 8 pages, U.S. Appl. No. 14/509,662, filed Oct. 8, 2014.
Foreign Communication From a Counterpart Application, PCT Application No. PCT/CN2015/090922, International Search Report dated Dec. 25, 2015, 8 pages.
Foreign Communication From a Counterpart Application, PCT Application No. PCT/CN2015/090922, Written Opinion dated Dec. 25, 2015, 5 pages.
Notice of Allowance dated Sep. 1, 2016, 10 pages, U.S. Appl. No. 14/969,610, filed Dec. 14, 2015.
Office Action dated Apr. 14, 2016, 21 pages, U.S. Appl. No. 14/969,610, filed Dec. 15, 2015.
Foreign Communication From a Counterpart Application, European Application No. 15849323.9, Partial Supplementary European Search Report dated Sep. 28, 2017, 6 pages.
Machine Translation and Abstract of Japanese Publication No. JP2000101143, Apr. 7, 2000, 17 pages.
Machine Translation and Abstract of Japanese Publication No. JP2010503987, Feb. 4, 2010, 10 pages.
Machine Translation and Abstract of Japanese Publication No. JP2013098365, May 20, 2013, 12 pages.
Machine Translation and Abstract of Japanese Publication No. JP2013207023, Oct. 7, 2013, 22 pages.
Machine Translation and Abstract of Japanese Publication No. JPH05335669, Dec. 17, 1993, 8 pages.
Machine Translation and Abstract of Russian Publication No. RU2316864, Feb. 10, 2008, 12 pages.
Zhang, C., et al, "Tunable DFB lasers integrated with Ti thin film heaters fabricated with a simple procedure," Optics and Laser Technology, vol. 54, Jun. 14, 2013, pp. 148-150.
Foreign Communication From a Counterpart Application, Russian Application No. 2017115722, Russian Office Action dated May 18, 2018, 8 pages.
Foreign Communication From a Counterpart Application, Russian Application No. 2017115722, English Translation of Russian Office Action dated May 18, 2018, 7 pages.
Foreign Communication From a Counterpart Application, Russian Application No. 2017115722, Russian Search Report dated May 18, 2018, 2 pages.
Foreign Communication From a Counterpart Application, Russian Application No. 2017115722, English Translation of Russian Search Report dated May 18, 2018, 3 pages.
Foreign Communication From a Counterpart Application, Japanese Application No. 2017-518902, Japanese Office Action dated Jun. 4, 2018, 3 pages.
Foreign Communication From a Counterpart Application, Japanese Application No. 2017-518902, English Translation of Japanese Office Action dated Jun. 4, 2018, 4 pages.
Machine Translation and Abstract of Japanese Publication No. JPH09237703, Sep. 9, 1997, 19 pages.
Foreign Communication From a Counterpart Application, Korean Application No. 10-2017-7011575, Korean Office Action dated May 14, 2018, 6 pages.
Machine Translation and Abstract of Chinese Publication No. CN101529675, Sep. 9, 2009, 18 pages.
Machine Translation and Abstract of Chinese Publication No. CN102545040, Jul. 4, 2012, 9 pages.
Machine Translation and Abstract of Chinese Publication No. CN103094831, May 8, 2013, 20 pages.

(56) References Cited

OTHER PUBLICATIONS

Foreign Communication From a Counterpart Application, Chinese Application No. 201580051792.8, Chinese Search Report dated Aug. 17, 2018, 2 pages.
Foreign Communication From a Counterpart Application, Chinese Application No. 201580051792.8, Chinese Office Action dated Aug. 27, 2018, 8 pages.

* cited by examiner

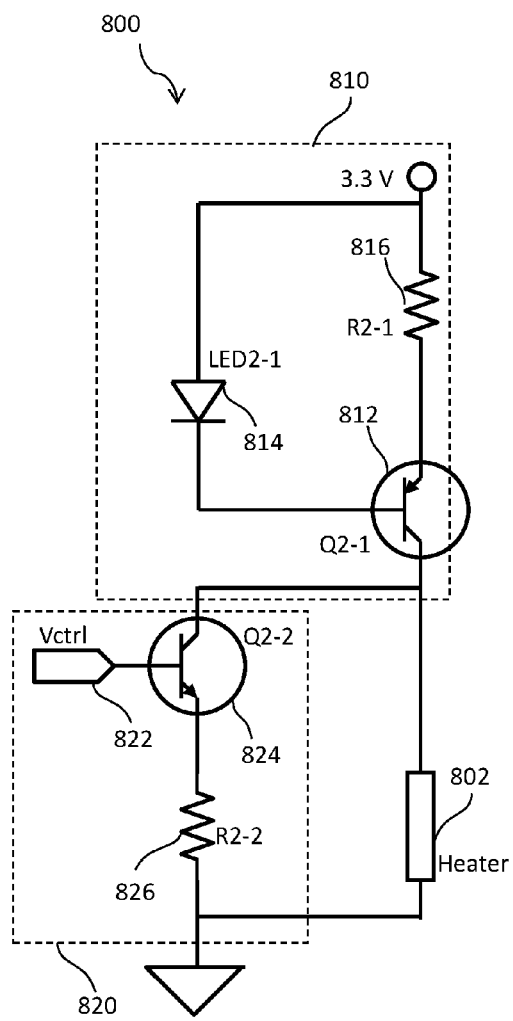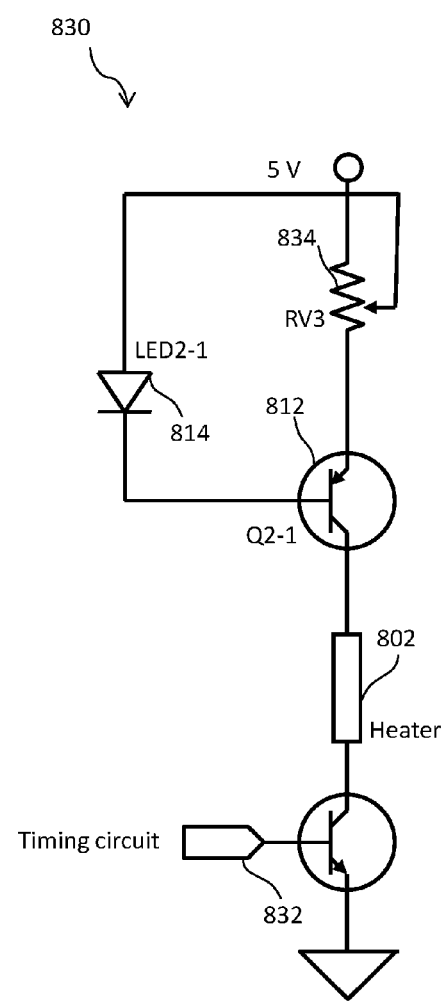
*FIG. 8A*  *FIG. 8B*

THERMAL COMPENSATION FOR BURST-MODE LASER WAVELENGTH DRIFT

CROSS-REFERENCE TO RELATED APPLICATIONS

This application is a continuation application of U.S. patent application Ser. No. 14/969,610, filed on Dec. 15, 2015 by Futurewei Technologies, Inc. and titled "Thermal Compensation for Burst-Mode Laser Wavelength Drift," which is a continuation-in-part of U.S. patent application Ser. No. 14/509,662, filed on Oct. 8, 2014 by Futurewei Technologies, Inc. and titled "Thermal Compensation for Burst-Mode Laser Wavelength Drift," now U.S. Pat. No. 9,246,307, all of which are incorporated herein by reference.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Passive optical networks (PONs) have user or customer end devices and operator end devices in communication with each other. PONs may employ time-division multiplexing, in which end users share a wavelength in different time periods to communicate with the operator end (e.g., optical line termination (OLT)) via an upstream link. Accordingly, some transmitters on the user or customer side, such as those in an optical network unit (ONU), may have lasers working in a burst mode. In the burst mode, an ONU transmitter may be assigned a small time period and may send upstream signals only within its own time period. At other times, the ONU transmitter may have a bias current (or voltage) below its threshold current value (e.g., zero bias current), and therefore stay inactive.

When a burst-mode laser is enabled, it may emit or transmit an optical signal, on which radio frequency (RF) signals may be added. During emission, a temperature of the laser chip may increase slowly, causing the optical wavelength to drift or shift. In a time- and wavelength-division multiplexing (TWDM)-PON system that shares both time and wavelengths, multiple wavelengths may be used in both a downstream direction and an upstream direction. In the upstream direction, for example, a demultiplexer (DeMUX) may be used to separate different wavelengths sent from multiple ONUs. Each output channel in the DeMUX, similar to a filter, may have pass bands of various shapes such as a flat shape or a Gaussian shape. The wavelength shift of an optical signal during a burst period may cause problems at the filter. For example, if the peak-intensity wavelength of the optical signal is close to an edge of the filter pass band, after wavelength shift a portion of the optical signal may be filtered out because the shifted wavelength falls out of the pass band. The optical signal may consequently vary in power, which may cause data error problems. Therefore, the wavelength shift of burst-mode lasers is a problem to be solved.

SUMMARY

In an embodiment, the disclosure includes an apparatus comprising a burst-mode laser comprising an active layer and configured to emit an optical signal during a burst period, wherein a temperature change of the burst-mode laser causes the optical signal to shift in wavelength, and a heater thermally coupled to the active layer and configured to reduce a wavelength shift of the optical signal during the burst period by applying heat to the active layer based on timing of the burst period.

In another embodiment, the disclosure includes a method for temperature compensation during operation of a burst-mode laser that is thermally coupled to a heater, the method comprising receiving a burst enable signal indicating the start of a burst period, emitting an optical signal with at least one wavelength during the burst period, and substantially maintaining a temperature of the burst-mode laser throughout the emission of the optical signal to reduce wavelength shift of the optical signal, wherein substantially maintaining the temperature comprises applying, using the heater, heat to the burst-mode laser based on the burst enable signal.

In yet another embodiment, the disclosure includes a laser system comprising a burst-mode laser comprising a metallic layer that serves as an electrode pad for the burst-mode laser, and an electric heater situated atop the burst-mode laser and comprising a first titanium (Ti) layer atop the metallic layer, a silicon dioxide ($SiO_2$) layer atop the first titanium layer, a second Ti layer atop the silicon dioxide layer, and a platinum (Pt) layer atop the second titanium layer, wherein the second Ti layer and the Pt layer serve as a heating pad for the electric heater, and wherein the $SiO_2$ layer has a thickness no more than 300 nanometers to allow efficient heat transfer from the electric heater to the burst-mode laser, and to block current injection from the heating pad to the electrode pad.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

FIG. 3 shows exemplary simulation results of temperature changes of a burst-mode laser under three different conditions: (1) heater only, (2) laser only, and (3) both heater and laser turned on.

FIG. 5 shows another exemplary simulation results of temperature changes of the burst-mode laser under three different conditions: (1) heater only, (2) laser only, and (3) both heater and laser turned on.

FIGS. 8A-8D show embodiments of four driving circuits, each for generating a heating current that feeds into a heater.

DETAILED DESCRIPTION

Figure 1A:
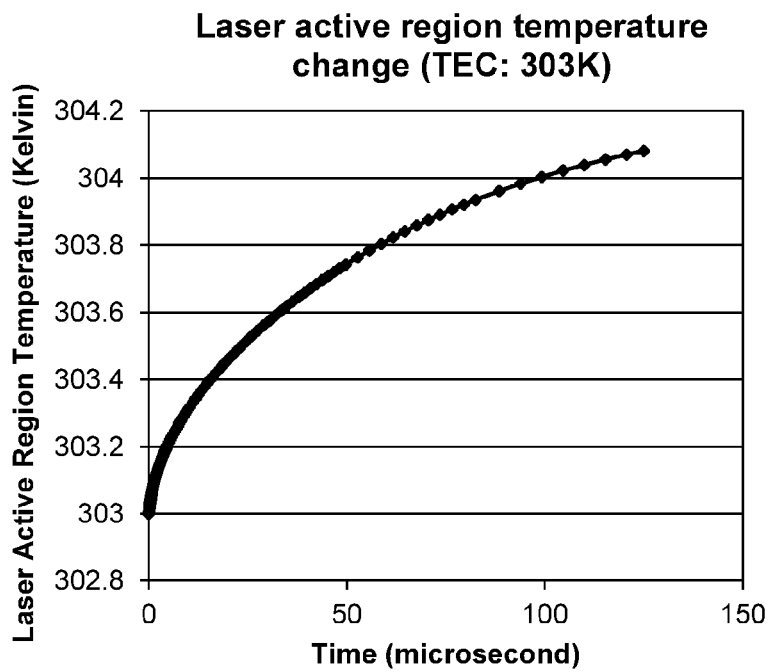
FIG. 1A and FIG. 1B are exemplary simulation results of temperature increase and wavelength shift, respectively, for a distributed feedback (DFB) laser within one burst time period without temperature compensation by a heater.

It should be understood at the outset that, although an illustrative implementation of one or more example embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents. The drawing figures are not necessarily to scale. Certain features of embodiments may be shown exaggerated in scale or in somewhat schematic form and some details of conventional elements may not be shown in the interest of clarity and conciseness.

The present disclosure teaches example embodiments to reduce the wavelength shift of a burst-mode laser in a burst period by stabilizing a temperature of the laser during emission of optical signals. In an embodiment, an electric heater is placed close to an active layer of the laser to heat the laser anode surface. Heat may be applied to the laser before a burst period or right at the start of the burst period to rapidly raise the temperature of the active area. Then, as the laser starts emitting an optical signal shortly after the start of the burst period, the amount of applied heat may be reduced, causing laser temperature to fall slowly over a short period, e.g., about 10 microseconds (μs). During a latter portion of the burst period, the heat may be turned off completely to further decrease temperature. In effect, the temperature rise caused by emitting the optical signal is balanced or compensated by the temperature decrease caused by the reduction of heat applied on the laser. Accordingly, the overall temperature of the laser may be stabilized, which in turn reduces wavelength shift in the burst period. The disclosed embodiments may lower upstream wavelength drift and keep receiver input optical power almost constant, thereby improving the performance and quality of a TWDM-PON system. A Gaussian shaped pass-band DeMUX may be used, in essence allowing more choice in the design of TWDM-PON system components.

An optical signal is defined herein as at least one optical wave having at least one optical wavelength and carrying any type of signal (e.g., RF signal). When an optical wave without any RF signal is emitted, e.g., for reference purposes, the wavelength information and/or power of the optical wave may still be considered types of signals. Embodiments disclosed herein may be applied to any suitable type of burst-mode lasers including DFB lasers and distributed Bragg reflector (DBR) lasers. Further, a burst-mode laser disclosed herein may be located anywhere and be used in any suitable system. For example, the burst-mode laser may reside in a transmitter at the user end (e.g., in an ONU) or at the operator end (e.g., in an OLT) of a PON system. In the present disclosure, functioning of the heat compensation may be discussed first, followed by the structures and fabrication details of the heater.

When an injection current makes a laser emit an optical signal, the current also heats the laser because the laser has an ohmic contact resistance. The heating causes a temperature of the laser to increase. The temperature of some burst-mode laser chips may be regulated via thermal electric control (TEC), in which case a stable temperature gradient may be formed after several hundred microseconds. Nevertheless, the laser chip temperature may still change due to the applied current and the optical signal.

Figure 1B:
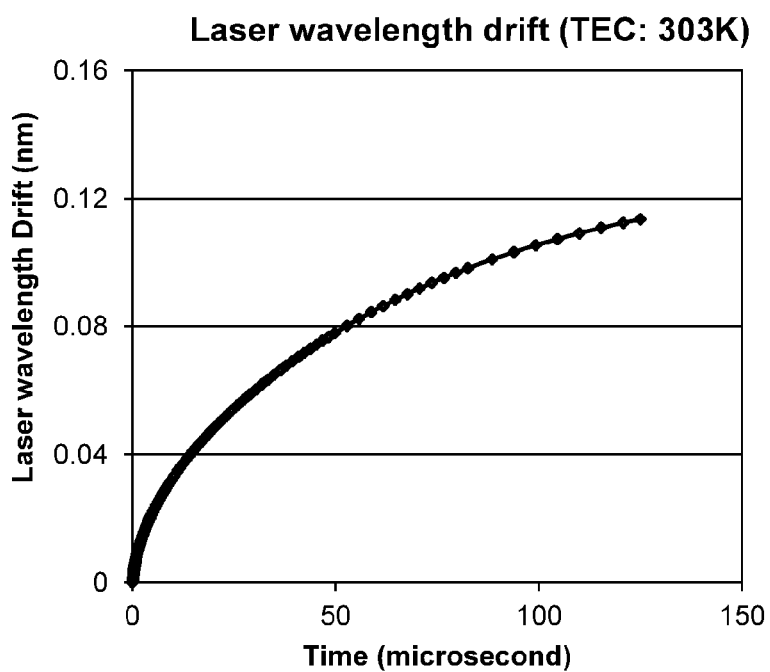

FIG. 1A and FIG. 1B are exemplary simulation results of temperature increase and wavelength shift, respectively, for a DFB laser within a burst time period of 125 μs without thermal compensation by a heater. Specifically, FIG. 1A shows the temperature increase with time in an active area of a DFB laser during the burst period with the x-axis being time and the y-axis being the laser active region temperature. FIG. 1B shows the wavelength increase (i.e., red drift) of an optical signal emitted by the DFB laser during the burst period with the x-axis being time and the y-axis being the amount of laser wavelength drift. An average temperature increase for laser optical confinement area may be about 1 Kelvin (K) to 1.5 K over a burst period of about 125 μs, where the temperature increase may also depend on an average output optical power of the laser. FIG. 1A further shows that, at the beginning of burst period, the temperature change is relatively faster, and that, toward the later part of the burst mode period, temperature change may enter into a near-saturation region and vary at a slower slope. The laser temperature change results in an optical wavelength shift. As shown in FIG. 1B, around the working ambient temperature of about 30 degrees Celsius (° C.) (or 303 degrees K), 1 K in laser temperature increase may cause the optical wavelength to shift about 0.105 nanometer (nm). Accordingly, an empirical formula may be concluded from the simulation:

$$d\lambda = 0.105 \text{ nm}/k * dT, \quad (1)$$

where $d\lambda$ denotes wavelength shift and $dT$ denotes temperature change. However, these values are only intended as examples, as temperature increase and wavelength shift may also depend on more factors such as an output power level of the laser.

In order to reduce the wavelength drift when a laser operates in a burst mode and thus stabilize the wavelength, an active area temperature of the laser may be stabilized to reduce temperature change. In an embodiment, a heater may be fabricated on the top of an anode electrode pad for the burst-mode laser. Therefore, the heater resides right on top of the laser active region so that it may heat the laser active area quickly and efficiently. For example, as shown in FIG. 3 (further described below), with application of heat the laser temperature may rise 1° C. within about 1 μs.

Figure 2A:
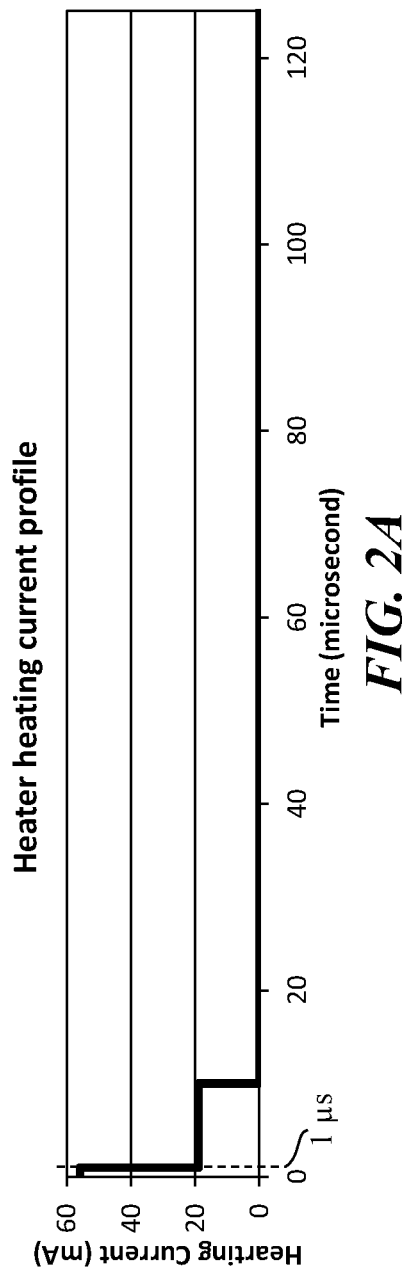
FIG. 2A shows an exemplary profile of a heating current used in a simulation.
Figure 2B:
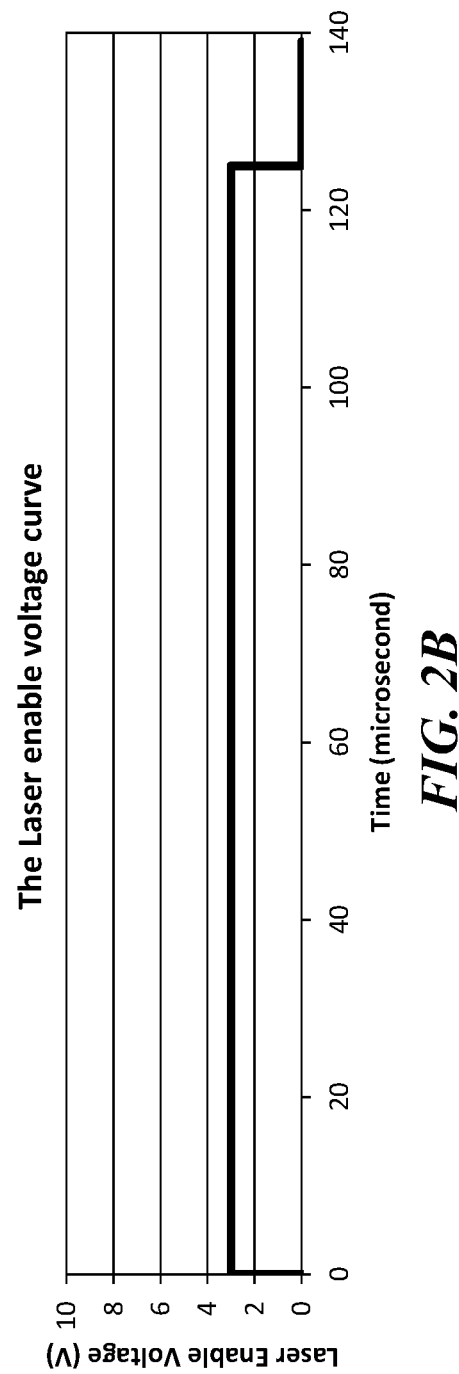
FIG. 2B shows an exemplary profile of a laser enable voltage used in the same simulation as FIG. 2A.

Various embodiments of heat application dynamically based on a burst enable signal are disclosed herein. In a first embodiment, a burst enable signal (e.g., an ONU transmitter enable signal) and a heating current are applied simultaneously. In other words, the heater starts heating when the laser enabling signal turns on. The burst enable signal may be implemented as any suitable signal (e.g., voltage or current). The burst enable signal controls timing of a burst period and indicates the start of the burst period. The burst-mode laser may start emitting an optical signal shortly (e.g., one μs) after the burst enable signal turns from a logic low to a logic high. A heating current for the heater may be designed to have any suitable profile. FIG. 2A shows an exemplary profile of a heating current used in a simulation, and FIG. 2B shows an exemplary profile of a laser enable voltage used in the same simulation.

As shown in FIG. 2A, the heating current profile has three temporal portions associated with three different steps. The first step is from a start of the burst period to about 1 µs, where the current is set to a maximal level (e.g., about 56 milliamperes (mA)). The second step is from about 1 µs to about 10 µs, where the current is reduced to an intermediate or lower level (e.g., about 18.8 mA). The third and last step is from about 10 µs to the end of the burst period, where the heater is turned off with zero current. As shown in FIG. 2B, the burst enable signal stays high throughout the burst period, and turns low at about 125 µs to end the burst period. The laser may start emitting the optical signal with at least one wavelength shortly (e.g., 1 µs) after the burst enable signal turns high (the laser warms up).

Figure 3:
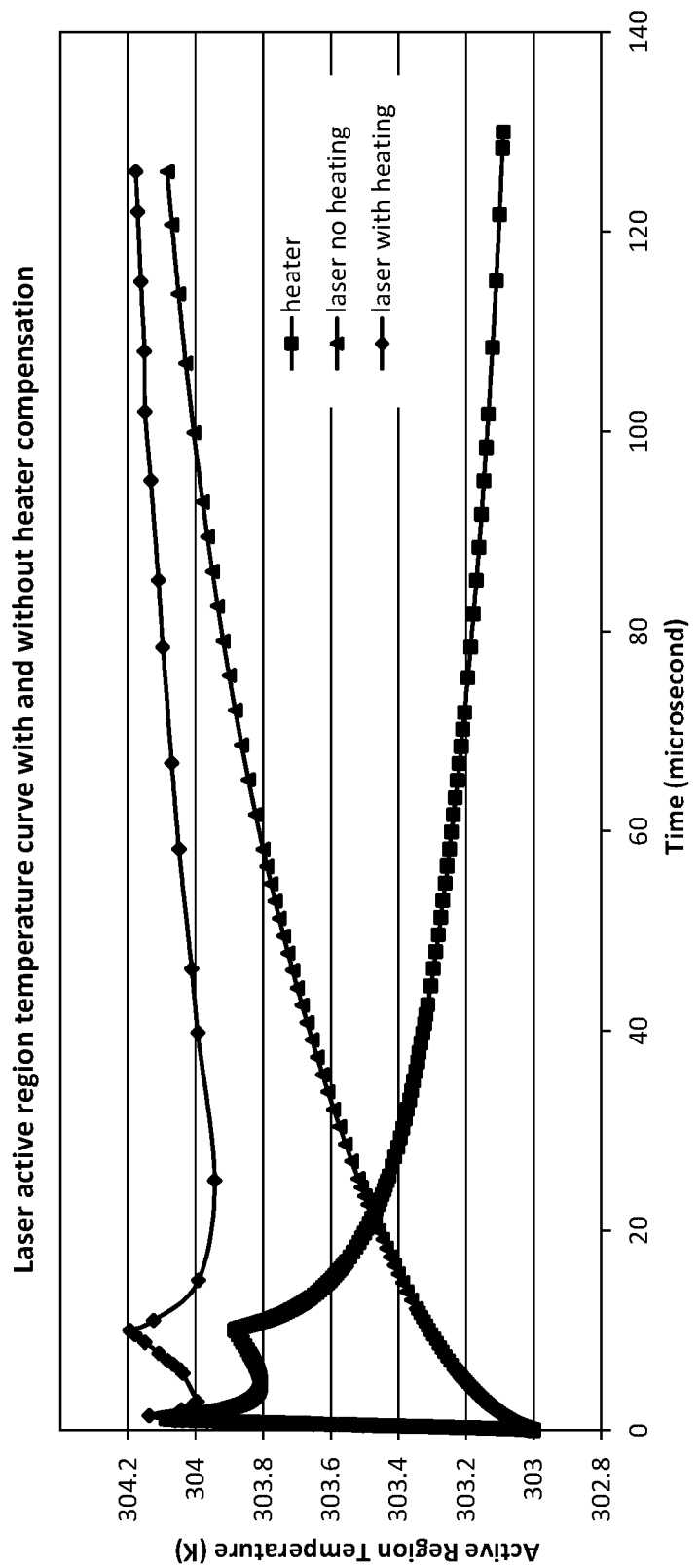

FIG. 3 shows exemplary simulation results of temperature changes of a burst-mode laser under three different conditions. Condition (1), represented by square markers, has the heater turned on with a current profile shown in FIG. 2A, and has the laser turned off. Condition (2), represented by triangle markers, has the laser turned on with a burst enable voltage profile shown in FIG. 2B, and has the heater turned off. Condition (3), represented by diamond markers, has both the heater and the laser turned on according to the profile in FIG. 2A and FIG. 2B, respectively. As shown in FIG. 2A, the heating current is first set to a maximal level for a short period (e.g., about 1 µs). As shown for condition (1) of FIG. 3, the maximal heating current heats the laser active area quickly, causing an average temperature to rise for about one degree Celsius (e.g., from about 303 K to about 304.1 K) in the first microsecond. After the first microsecond, the heating current may decrease to stop the laser temperature from continuing to increase. As shown in FIG. 2A, the heating current may be lowered (e.g., from about 56 mA to about 18.8 mA) for another short period (e.g., about 10 µs). As shown for condition (1) of FIG. 3, the lower current causes the laser chip temperature to vary or fluctuate over this period (e.g., between about 303.8 K and about 304.2 K). After about 10 µs, the heating current is turned off, and the laser temperature may naturally decrease over the rest of the burst period (e.g., from about 303.9 K to about 303.1 K).

Condition (2) of FIG. 3 is similar to FIG. 1B, where the laser temperature increases as a result of its bias and modulation current. Combining conditions (1) and (2) for condition (3) in FIG. 3, it is clear that the decreasing temperature of the heater can compensate for the increasing temperature of the laser, resulting in a largely stabilized temperature profile. Under condition (3), the heating current and the laser enable signal are turned on simultaneously, causing the laser temperature to stay between about 303.9 K and about 304.2 K throughout the burst period. As temperature variation is reduced from about 1 K to less than about 0.3 K, wavelength shift is reduced accordingly. Applying equation (1), $d\lambda = 0.105$ nm*$dT$, and assuming a temperature change $dT$ of 0.3 K, the wavelength shift would be substantially stable with a shifting range within about 0.0315 nm. The corresponding frequency shift would be within the range of 5 gigahertz (GHz). More generally, when a duration of the burst period is about 125 microseconds, the temperature of the burst-mode laser may be controlled to change no more than about ±0.2° C., and the wavelength shift of the optical signal may be no more than about ±0.02 nm.

Figure 4A:
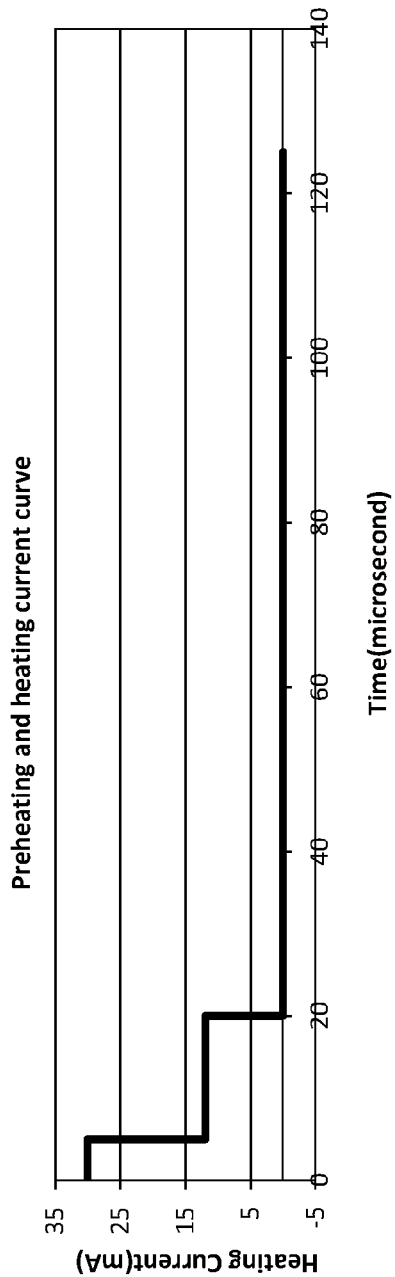
FIG. 4A shows another exemplary profile of a heating current.
Figure 4B:
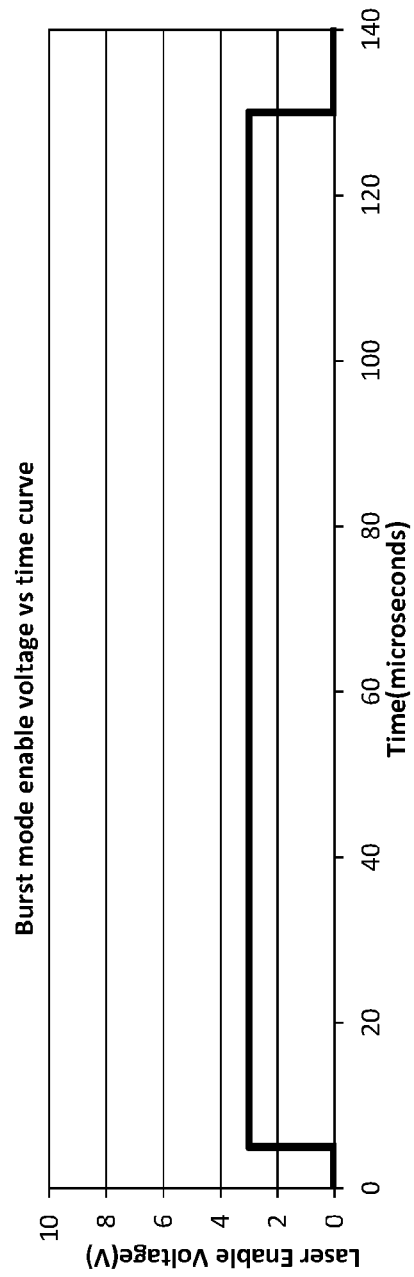
FIG. 4B shows an exemplary profile of a laser enable voltage used in the same simulation as FIG. 4A.
Figure 5:
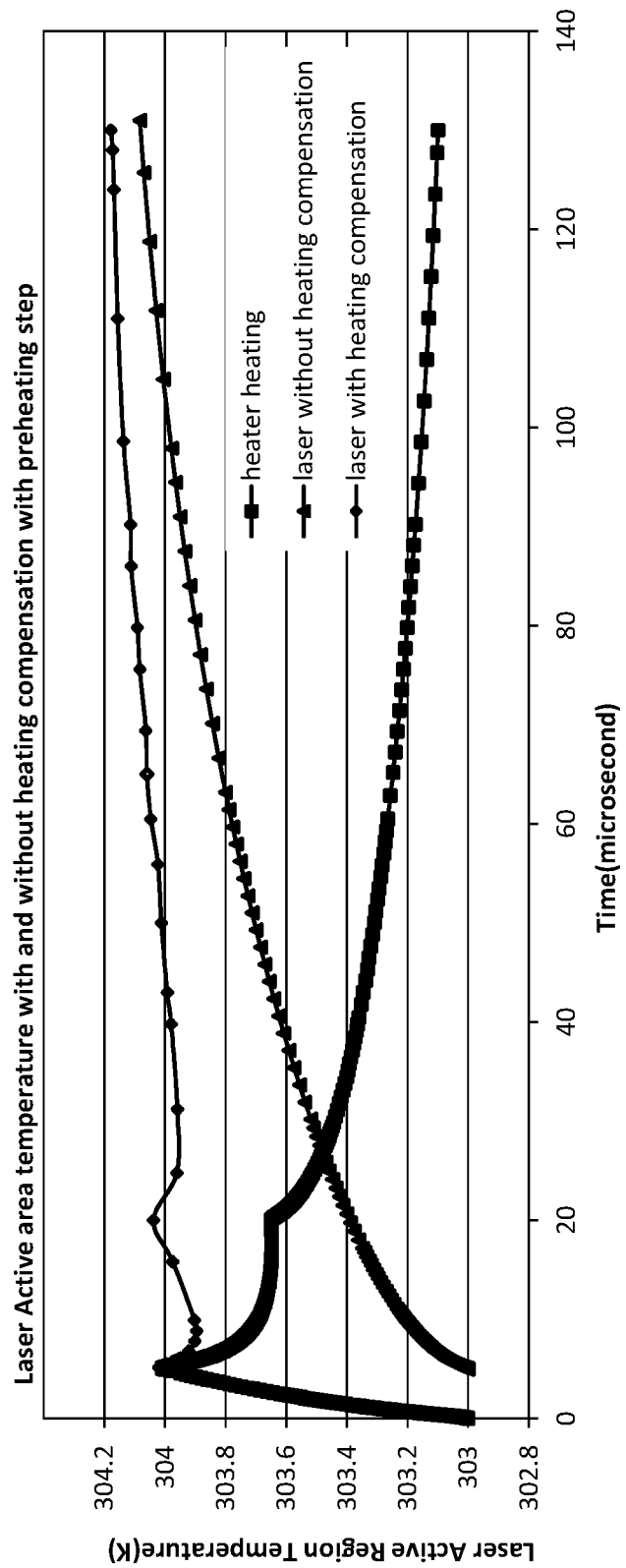

In a second embodiment of applying heat to a laser based on a burst enable signal, the heat may be applied prior to the start of the burst period. FIG. 4A shows an exemplary profile of a heating current used in a simulation of the second embodiment, FIG. 4B shows an exemplary profile of a laser enable voltage used in the same simulation, and FIG. 5 shows exemplary simulation results of temperature changes of the burst-mode laser under three different conditions. As one of ordinary skill in the art would understand similarities between FIG. 4A and FIG. 2A, between FIG. 4B and FIG. 2B, and between FIG. 5 and FIG. 3, in the interest of conciseness, further discussions focus on differences among them. In the second embodiment, the burst-mode laser is preheated by the heater at a maximal level heating current to cause its temperature to rise about 1 K before the start of the burst period. As shown in FIG. 4A, a maximal current of about 30 mA is supplied to the heater for a first period (e.g., about 5 µs) before the laser burst enable signal is turned on. Compared with FIG. 2A, where the maximal current was about 56 mA for the same laser, the maximal current may not need to be as high because the duration of heating is now longer. When the burst enable signal is turned on, the heating current is reduced to a lower value to substantially maintain its temperature or have its temperature decrease very slowly for about 10 to 15 µs. After that, the heater is turned off for the rest of the burst period, causing the laser temperature to drop. As discussed above, the laser temperature decrease caused by the turned-off heater compensates for the laser temperature rise caused by bias and modulation current. As a result, when both the laser and the heater are turned on as specified in FIG. 4A and FIG. 4B, the overall temperature is substantially stabilized, varying between about 303.9 K and about 304.2 K throughout the burst period, as shown in FIG. 5.

When a heating current has a simple step profile, such as shown in FIG. 2A and FIG. 4A, a secondary peak temperature may be observed. For example, the laser temperature reaches a peak of about 304.2 K at about 10 µs in FIG. 3 and reaches a small peak of about 304.05 K at about 20 µs in FIG. 5. In a third embodiment, the heating current profile may therefore be altered to reduce or avoid the secondary peaks. In an embodiment, the heating current may be set to quickly reach a maximal level, and then decrease continuously over a time period. For example, an exponential continuous decrease may be realized using a resistor-capacitor (RC) circuit. The current may last until the end of the burst period or be turned off in the middle of the burst period, depending on factors such as the maximal current level and rate of current decrease. By properly designing the heating current profile, the overall temperature of the laser may be even more stabilized, further reducing the wavelength shift of optical signals.

Figure 6:
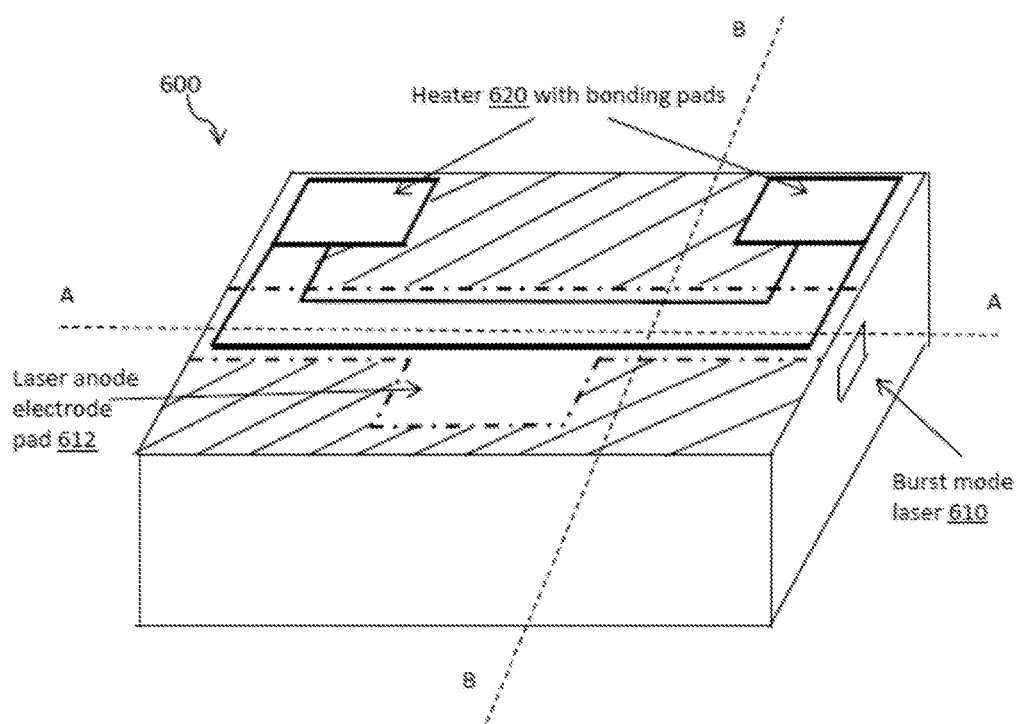
FIG. 6 shows a perspective view of an embodiment of a laser system.

FIG. 6 illustrates a perspective view of an embodiment of a laser system 600, which may comprise a burst-mode laser 610 and an electric heater 620. The laser system 600 may be implemented using a single chip (e.g., all components may be monolithically fabricated on the same chip) or multiple chips (e.g., some components may be fabricated separately and then bonded together). Depending on the design, the heater 620 may be considered part of the laser 610 or thermally coupled to the laser 610. For example, when all components of the laser system 600 are monolithically fabricated on the same chip, the laser system 600 may sometimes simply be referred to as a laser. As shown in FIG. 6, the heater 620 with bonding pads may be integrated atop a laser anode electrode pad 612 for the laser 610 such that the heater 620 is located right on top of an active layer or region of the laser 610. Since the heater is close to the active layer, when a heating current runs through the heater 620 via heating pads, the heater 620 may increase a temperature of the laser active layer quickly (e.g., an increase of about 1 K within about 1 μs). In an embodiment, the heater may be made of titanium (Ti) and platinum (Pt) thin films or layers, where Ti is deposited atop a silicon dioxide ($SiO_2$) layer that is used to isolate laser injection and heating current. The Pt layer may serve as the main heating layer. The bonding pads have a gold (Au) layer atop the Pt layer. The gold layer provides for wire bonding. In an embodiment, the bonding pads portion may have the gold layer while the rest of the heater 620 and its corresponding Pt layer do not have the gold layer. Underneath the isolating $SiO_2$ layer, the laser anode electrode may comprise Ti, Pt, and/or gold layers. It should be understood that directional terms mentioned herein, such as top, bottom, atop, on top of, below, underneath, vertical, horizontal, etc., are meant to be relative and do not impose any limitation on the orientation of the laser system or its components.

Figure 7A:
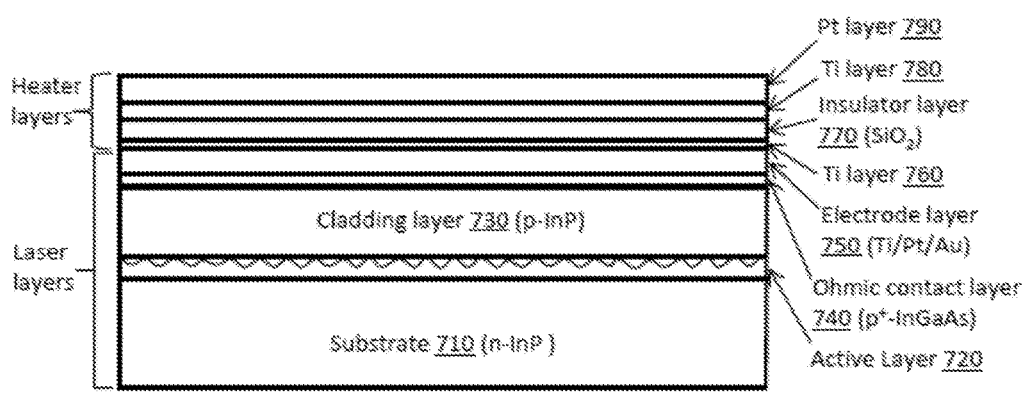
FIG. 7A shows a cross-sectional view of the laser system of FIG. 6 along the A-A line.

FIG. 7A shows a cross-sectional view of the laser system 600 of FIG. 6 along the A-A line, in essence presenting a detailed vertical layout of the laser system 600. The laser system 600 may be fabricated using any suitable technology in a layer-by-layer fashion. Layers of the laser comprise, from bottom to top, a substrate 710 made of n-type indium phosphide (n-InP), an active layer 720, a cladding layer 730 made of p-type InP, an ohmic contact layer 740 made of heavily-doped indium gallium arsenide ($p^+$-InGaAs), and an electrode layer 750 made of metals such as Ti/Pt/Au layers. The electrode layer 750 may be deposited for the laser anode electrode pad. The active layer 720, sometimes referred to as an active region or an active area, may comprise waveguide layers in a cavity for generating optical signals.

Heater layers reside atop the laser layers and comprise, from bottom to top, a first Ti layer 760, an insulator layer 770 made of $SiO_2$, a second Ti layer 780, and a Pt layer 790. The second Ti layer 780 and the Pt layer 790 together may serve as a heating pad for the heater since both layers are conductive and connected. During fabrication, to integrate the heater on the top of the Au sub-layer of the electrode layer 750, about 5 to 10 nm of Ti layer 760 may be deposited before about 200 nm of the insulator layer 770 is deposited. The two Ti layers 760 and 780 may help bond $SiO_2$ in the insulator layer 770 to other metals. The insulator layer 770 may not be too thick so that it can allow efficient heat transfer from the electric heater to the burst-mode laser, and may not be too thin so that it can block current injection from the heating pad to the electrode pad. For example, the insulator layer 770 may have a thickness between 50-200 nm, 100-300 nm, or 150-250 nm, or in other suitable ranges.

Figure 7B:
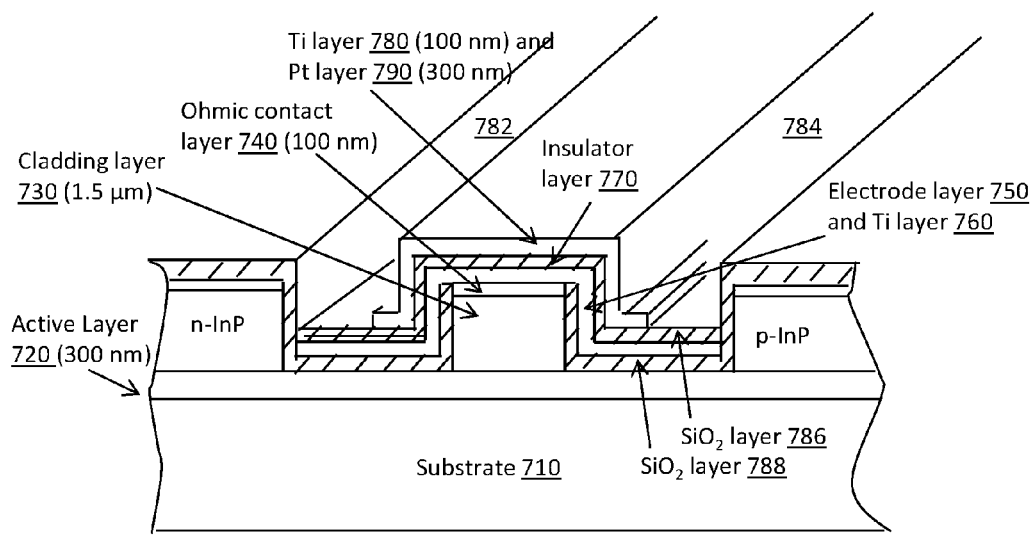
FIG. 7B shows a perspective cross-sectional view of the laser system of FIG. 6 along the B-B line.

FIG. 7B shows a perspective cross-sectional view of the laser system 600 of FIG. 6 along the B-B line from a direction perpendicular to that of FIG. 7A. The laser may be a ridge waveguide DFB laser with a heater situated on top. According to the embodiment shown in FIG. 7B, the active layer 720 is about 300 nm thick and may be on top of the substrate 710; the cladding layer 730 is about 1.5 μm thick; the ohmic contact layer 740 is about 100 nm thick; the electrode layer 750 is about 30 nm, 50 nm, and 500 nm thick for the respective layers of Ti, Pt, and Au; the first Ti layer 760 is about 5 nm thick; the insulator layer 770 may be about 200 nm thick; and the second Ti layer 780 and the Pt layer 790 serving together as the heating electrode are 100 nm and 300 nm, respectively. Further, the active layer 720 comprising a ridge waveguide may have a width between about 2.5 μm to about 4 μm. Two trenches 782 and 784, running parallel to the heating pad in the center, may each have a width between about 10 μm to about 15 μm. In the trench area, an upper $SiO_2$ layer 786 may be about 200 nm thick, and a lower $SiO_2$ layer 788 may be about 300 nm thick.

Figure 7C:
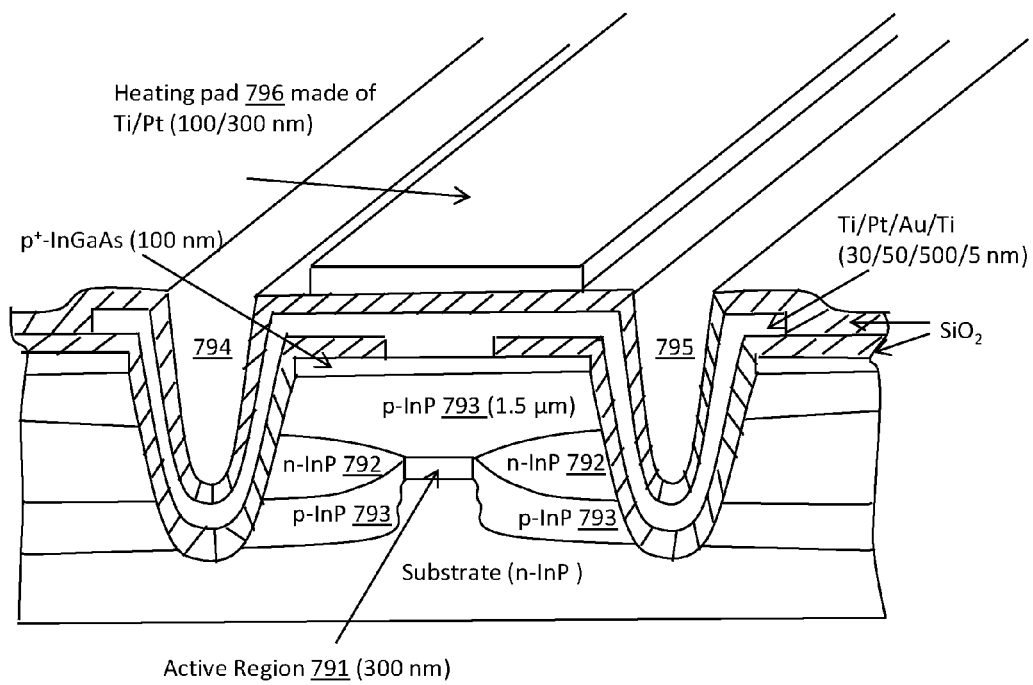
FIG. 7C shows a perspective cross-sectional view of a buried heterostructure DFB laser.

FIG. 7C shows a perspective cross-sectional view of a buried heterostructure DFB laser, which has a heating pad 796 situated on top of an active region 791. For purposes of the present disclosure, the heater design and fabrication for FIG. 7C is largely similar to FIG. 7B, thus similarities are not further discussed in the interest of conciseness. Distinct from a ridge waveguide laser, the buried heterostructure DFB laser has an active region 791 fully embedded or "buried" between multiple n-InP layers 792 and p-InP layers 793. Further, a mesa width between the two trenches 794 and 795 may be between about 8 μm to about 12 μm, and the active region 791 may have a width of about 1 μm to about 2 μm.

Figure 8C:
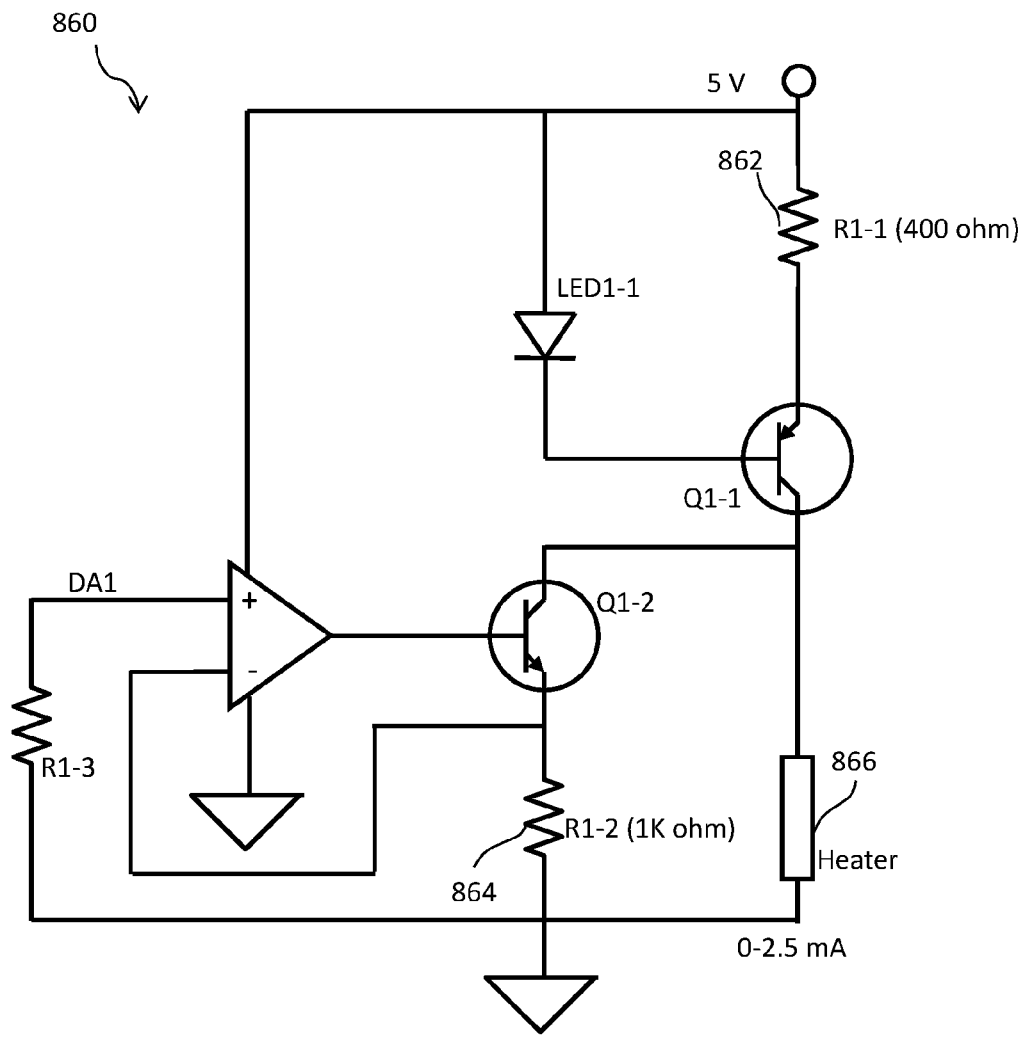

FIGS. 8A-8D illustrate embodiments of driving circuits 800, 830, 860, and 890, each for generating a heating current that feeds into a heater disclosed herein. Specifically, as shown in FIG. 8A, the driving circuit 800 serves as a current source for a heater (e.g., the heater 620 in FIG. 6). The circuit 800 may comprise three parts: (1) a heater 802, which may be considered part of a DFB laser; (2) a constant current source 810 formed with a transistor 812 (denoted as Q2-1), a diode 814 (denoted as LED2-1) and a resistor 816 (denoted as R2-1); and (3) a current modulator 820 formed with a control input voltage (Vctrl) 822, a transistor (Q2-2) 824 and a resistor (R2-2) 826. Exemplary values for some of the components are given in FIG. 8A.

In the constant current source 810, the forward voltages of LED2-1 814 may be 1.5 volts (V), and the emitter-base voltage (Veb) of Q2-1 812 may be 0.6 V. Further, both voltages may vary with temperature following a similar voltage-temperature curve. As a result, a difference between the two voltages, which may be applied onto R2-1 816, may be insensitive to (or substantially independent of) the ambient temperature. Consequently, R2-1 816 may be able to produce a constant current substantially independent of the ambient temperature of the driving circuit. In other words, the current may be relatively stable when the temperature changes. Further, the value of R2-1 816 may be selected such that the current is sufficient for heating the laser as discussed above.

In the current modulator 820, if Vctrl 822 is set to a low value or zero, no current may flow through Q2-2 824. In this case, the heater 802 may accept all the current provided by the constant current source 810. Otherwise, If Vctrl 822 is set higher (e.g., higher than the turn-on threshold voltage for Q2-2 824), at least part of the current from the constant current source 810 may bypass through Q2-2 824 and R2-2 826, thereby reducing a current going through the heater 802. Thus, current modulation may be achieved by controlling a value of Vctrl 822. The response time of the current modulator 820 may be designed to be short (e.g., about 1 nanosecond (ns)) to ensure fast switching or modulation.

Figure 8D:
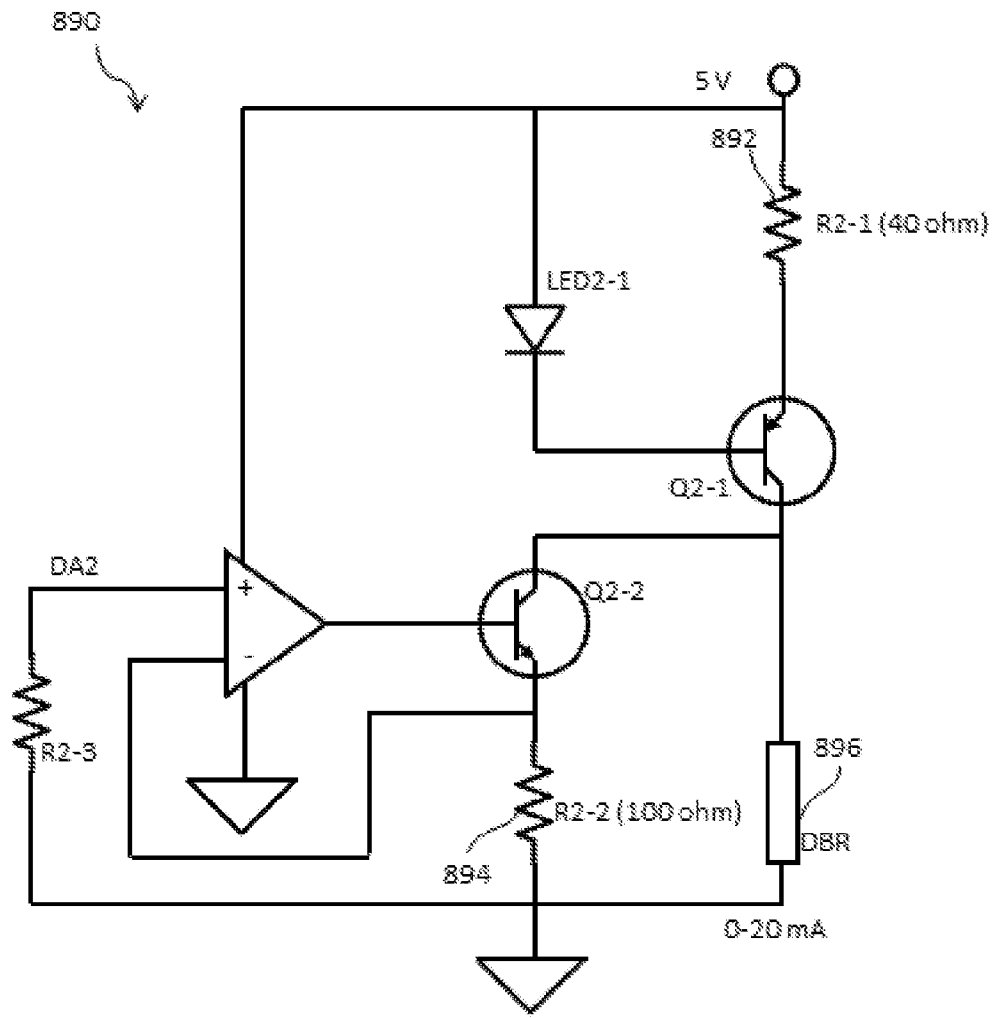

One of ordinary skill in the art would recognize that the driving circuits 830, 860, and 890 shown in FIGS. 8B-8D are largely similar to the driving circuit 800 in FIG. 8A. Thus, similarities are not further discussed. The driving circuit 830 in FIG. 8B may receive the output of a timing circuit 832, which may control the timing of each stage in a current profile (e.g., how long a current stays at a maximal level, a medium level, and zero). The output current of the driving circuit 830 can be preset to a certain value by adjusting the value of a potentiometer 834 (denoted as RV3). The driving circuit 830 may work at an on/off mode. The rising/falling time of the output current (e.g., the time of reaching from the zero level to the maximal level) may be no more than a few ns (e.g., about 1 ns).

The driving circuit 860 in FIG. 8C and the driving circuit 890 in FIG. 8D may each be precisely controlled with a digital-to-analog (DA) converter, which may be 12 or 16 bits in depth. The outputs of the DA converter in driving circuits 860 and 890 are labeled DA1 and DA2, respectively. During switching or modulation, the rising/falling time of the currents is about 1 µs. The main differences between driving circuits 860 and 890 are resistors values. In driving circuit 860, resistor 862 (R1-1) may be about 400 ohms and resistor 864 (R1-2) may be about 1000 ohms. The driving circuit 860 may generate a relatively small output current between about 0-2.5 mA, which may be suitable for a phase control laser 866. On the other hand, in driving circuit 890, resistor 892 (R2-1) may be about 40 ohms and resistor 894 (R2-2) may be about 100 ohms. The driving circuit 890 may generate a relatively big output current between about 0-20 mA, which may be suitable for a DBR laser 896.

Figure 9:
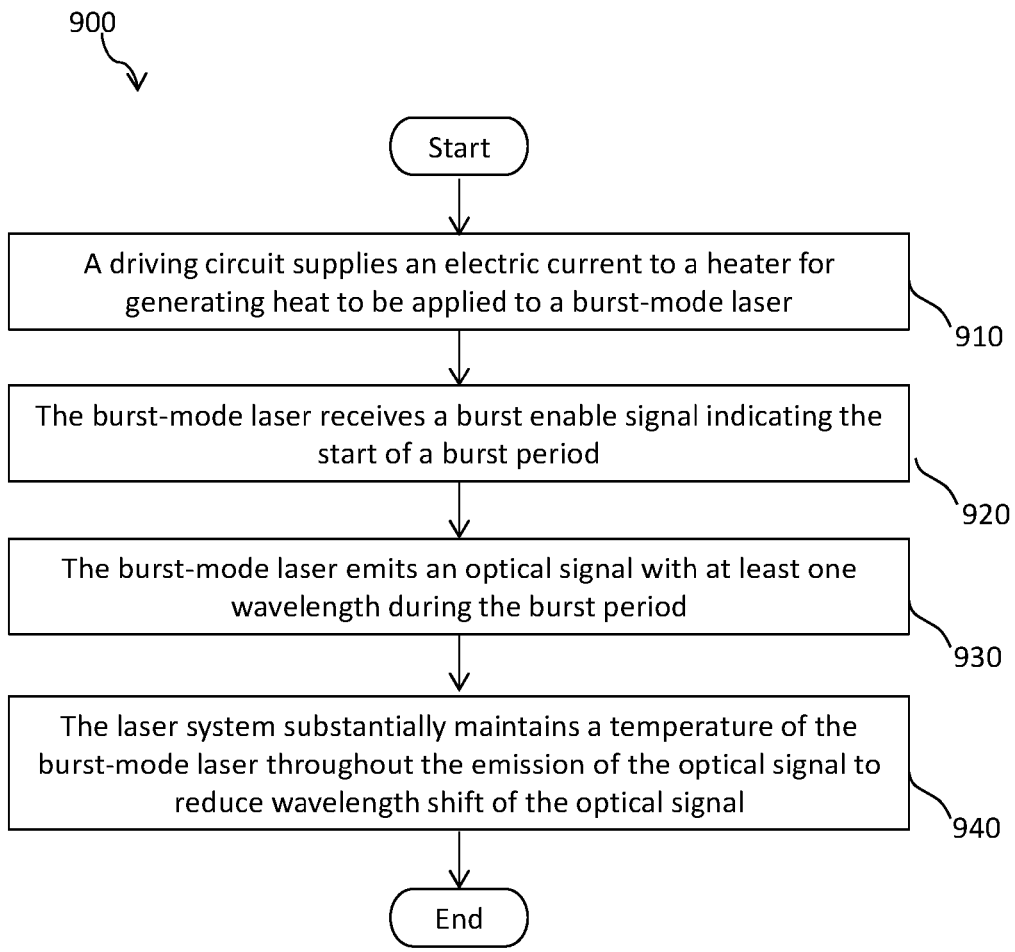
FIG. 9 is a flowchart of an embodiment of a method for temperature compensation during operation of a burst-mode laser.

FIG. 9 is a flowchart of an embodiment of a method 900 for temperature compensation during operation of a burst-mode laser. In a laser system (e.g., the laser system 600), the burst-mode laser may be a DFB laser that is thermally coupled to a heater, which in turn is coupled to a driving circuit. The method 900 starts in step 910, when the driving circuit supplies an electric current to the heater for generating heat to be applied to the burst-mode laser. In an embodiment, the electric current reaches a maximal level no later than the start of the emission of the optical signal and then decreases from the maximal level thereafter. In step 920, the burst-mode laser may receive a burst enable signal indicating the start of a burst period. It should be understood that steps 910 and 920 may be implemented in any sequential order. For example, the electric current may be supplied to the heater either before the start of the burst period or simultaneously with the start of the burst period.

In step 930, the burst-mode laser may emit an optical signal with at least one wavelength during the burst period. As the laser takes some time to warm up, the emission of the optical signal may start shortly (e.g., about 1 µs) after the burst period. In step 940, the laser system may substantially maintain a temperature of the burst-mode laser throughout the emission of the optical signal to reduce wavelength shift of the optical signal. In the present disclosure, substantially maintaining or stabilizing a temperature may mean controlling the drifting range within ±0.2 degree Celsius. Substantially maintaining the temperature may be realized by applying, using the heater, heat to the burst-mode laser dynamically based on the burst enable signal. The heat may be applied only during a first portion of the burst period and not during a latter portion of the burst period.

Figure 10:
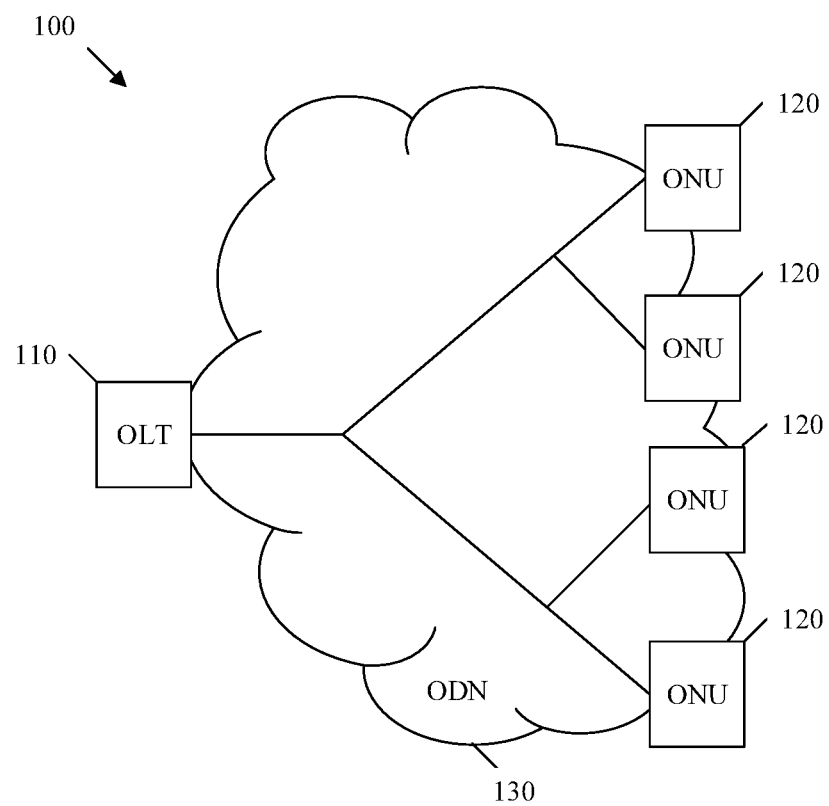
FIG. 10 is a schematic diagram of an embodiment of a PON.

FIG. 10 is a schematic diagram of an embodiment of a PON 100. The PON 100 comprises an OLT 110, a set of ONUs 120, and an ODN 130 that may be coupled to the OLT 110 and the ONUs 120. The laser systems disclosed herein may be implemented in various components in the PON 100, such as in transmitters of the ONUs 120 for their upstream communications with the OLT 110. The PON 100 may be a communications network that does not require any active components to distribute data between the OLT 110 and the ONUs 120. Instead, the PON 100 may use the passive optical components in the ODN 130 to distribute data between the OLT 110 and the ONUs 120. In an embodiment, the PON 100 may be a Gigabit PON (GPON), Next Generation Access (NGA) system, an Ethernet PON (EPON), a 10 Gigabit EPON, a wavelength division multiplexing (WDM) PON, a TWDM PON, or other types of PON, or combinations thereof.

In an embodiment, the OLT 110 may be any device that is configured to communicate with the ONUs 120 and another network (not shown). Specifically, the OLT 110 may act as an intermediary between the other network and the ONUs 120. For instance, the OLT 110 may forward data received from the network to the ONUs 120, and forward data received from the ONUs 120 onto the other network. Although the specific configuration of the OLT 110 may vary depending on the type of PON 100, in an embodiment, the OLT 110 may comprise a transmitter and a receiver. When the other network is using a network protocol, such as Ethernet or Synchronous Optical Networking/Synchronous Digital Hierarchy (SONET/SDH), that is different from the PON protocol used in the PON 100, the OLT 110 may comprise a converter that converts the network protocol into the PON protocol. The OLT 110 converter may also convert the PON protocol into the network protocol. The OLT 110 may be located at a central location, such as a central office, but may be located at other locations as well.

In an embodiment, the ODN 130 may be a data distribution system, which may comprise optical fiber cables, couplers, splitters, distributors, and/or other equipment. In an embodiment, the optical fiber cables, couplers, splitters, distributors, and/or other equipment may be passive optical components. Specifically, the optical fiber cables, couplers, splitters, distributors, and/or other equipment may be components that do not require any power to distribute data signals between the OLT 110 and the ONUs 120. Alternatively, the ODN 130 may comprise one or a plurality of active components, such as optical amplifiers. The ODN 130 may extend from the OLT 110 to the ONUs 120 in a branching configuration as shown in FIG. 10, but may be alternatively configured in any other point-to-multi-point configuration.

In an embodiment, the ONUs 120 may be any devices that are configured to communicate with the OLT 110 and a customer or user (not shown). Specifically, the ONUs 120 may act as an intermediary between the OLT 110 and the customer. For instance, the ONUs 120 may forward data received from the OLT 110 to the customer, and forward data received from the customer onto the OLT 110. Although the specific configuration of the ONUs 120 may vary depending on the type of PON 100, in an embodiment, the ONUs 120 may comprise an optical transmitter configured to send optical signals to the OLT 110 and an optical receiver configured to receive optical signals from the OLT 110. Additionally, the ONUs 120 may comprise a converter that converts the optical signal into electrical signals for the customer, such as signals in the Ethernet or asynchronous transfer mode (ATM) protocol, and a second transmitter and/or receiver that may send and/or receive the electrical signals to/from a customer device. In some embodiments, ONUs 120 and optical network terminals (ONTs) are similar, and thus the terms are used interchangeably herein. The ONUs 120 may be typically located at distributed locations, such as the customer premises, but may be located at other locations as well.

At least one example embodiment is disclosed and variations, combinations, and/or modifications of the example embodiment(s) and/or features of the example embodiment(s) made by a person having ordinary skill in the art are within the scope of the disclosure. Alternative embodiments that result from combining, integrating, and/or omitting features of the example embodiment(s) are also within the scope of the disclosure. Where numerical ranges or limitations are expressly stated, such express ranges or limitations may be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_1$, and an upper limit, $R_u$, is disclosed, any number falling within the range is specifically disclosed. In particular, the following numbers within the range are specifically disclosed: $R=R_1+k*(R_u-R_1)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. The use of the term "about" means+/− 10% of the subsequent number, unless otherwise stated. Use of the term "optionally" with respect to any element of a claim means that the element is required, or alternatively, the element is not required, both alternatives being within the scope of the claim. Use of broader terms such as comprises, includes, and having may be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are example embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several example embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various example embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. An apparatus comprising:
    a laser having an electrode pad and configured to emit an optical signal during a burst period;
    a heater at least partially disposed along both sidewalls of the electrode pad, the heater thermally coupled to the laser and configured to apply heat to the laser; and
    a driver of an electric current for generating the heat, wherein the heat is applied to the laser before a start of the burst period to substantially stabilize a temperature of the laser during the burst period.

2. The apparatus of claim 1, wherein the electric current is dedicated to the heater.

3. The apparatus of claim 1, wherein a duration of the heater applying the heat is about 125 microseconds (µs), wherein the temperature varies no more than about 0.2 degrees Celsius (° C.) when the heater applies the heat, and wherein a wavelength shift is no more than about 0.02 nanometers (nm) when the heater applies the heat.

4. The apparatus of claim 1, further comprising a driving circuit coupled to the heater and comprising a constant current source configured to generate the electric current.

5. The apparatus of claim 4, wherein the constant current source comprises:
    a transistor comprising a base; and
    a diode coupled to the base, and
    wherein the transistor and the diode have similar voltage-temperature characteristics such that the transistor and the diode are configured to create a constant voltage difference that is substantially independent of an ambient temperature of the driving circuit.

6. The apparatus of claim 1, wherein the laser is a distributed feedback (DFB) laser, wherein the heater comprises a silicon dioxide ($SiO_2$) layer, and wherein a thickness of the $SiO_2$ layer allows heat transfer from the heater to the laser, but blocks current injection from the heater to the laser.

7. An apparatus comprising:
    a laser having an electrode pad and configured to emit an optical signal during a burst period;
    a heater integrated at least partially over a top surface and along both sidewalls of the electrode pad, the heater thermally coupled to the laser and configured to:
        receive an electric current at or before a start of the burst period, wherein the electric current is used by the heater to generate heat; and
        apply the heat to the laser at the start of the burst period to stabilize a temperature of the laser during the burst period.

8. The apparatus of claim 7, wherein the electric current:
    reaches a first level from zero in no more than about 2 nanoseconds (ns);
    stays at the first level for no more than about 1 microsecond (µs);
    decreases to a second level;
    stays at the second level for no more than about 10 µs; and
    decreases to zero.

9. The apparatus of claim 8, wherein the electric current continuously decreases from the first level to zero by following an exponential curve.

10. A method for temperature compensation during operation of a laser that is thermally coupled to a heater, the method comprising:
    receiving an enable signal;
    emitting an optical signal with at least one wavelength during a burst period;
    supplying an electric current to the heater to generate heat, the electric current having reached a maximal level at least about 4 microseconds (µs) before the burst period and decreases to a second level until an application of the heat to the laser is terminated;

applying the heat to the laser before a start of the burst period based on the enable signal;
substantially maintaining a temperature of the laser throughout an emission of the optical signal; and
terminating the application of the heat to the laser at the end of the burst period.

11. The method of claim 10, wherein a duration of the application of heat is about 125 microseconds (μs), wherein the temperature of the laser varies no more than about 0.2 degrees Celsius (° C.) during the application of heat, and wherein a wavelength shift is no more than about 0.02 nanometers (nm) during the application of heat.

12. The method of claim 10, further comprising simultaneously receiving the electric current and the enable signal at the start.

13. The method of claim 10, wherein the electric current:
stays at the maximal level for no more than about 1 μs; and
stays at the second level for no more than about 10 μs.

14. The method of claim 10, further comprising supplying the electric current to the heater using a driving circuit, wherein the driving circuit comprises a constant current source, wherein the constant current source comprises a transistor and a diode coupled to the transistor, and wherein the transistor and the diode have similar voltage-temperature characteristics.

15. The method of claim 14, further comprising creating, using the transistor and the diode, a constant voltage difference that is substantially independent of an ambient temperature of the driving circuit.

16. A laser system comprising:
a laser comprising a metallic layer configured to serve as an electrode pad for the laser; and
an electric heater situated atop the laser and comprising:
a first titanium (Ti) layer atop the metallic layer;
a silicon dioxide (SiO$_2$) layer atop the first Ti layer, wherein the SiO$_2$ layer is configured to allow efficient heat transfer from the electric heater to the laser;
a second Ti layer positioned atop the SiO$_2$ layer; and
a platinum (Pt) layer atop the second Ti layer,
wherein the second Ti layer and the Pt layer are configured to serve as a pad for the electric heater.

17. The laser system of claim 16, wherein the SiO$_2$ layer comprises a first thickness of no less than about 100 nm, wherein the first Ti layer comprises a second thickness of about 4 nm to about 10 nm, and wherein the second Ti layer has a third thickness of about 280 nm to about 320 nm.

18. The laser system of claim 16, wherein the laser further comprises:
an active layer configured to generate an optical wave when an enable voltage is applied on an electrode pad;
a cladding layer atop the active layer and comprising p-type indium phosphide (p-InP); and
an ohmic contact layer atop the cladding layer, underneath the metallic layer, and comprising heavily-doped p-type indium gallium arsenide (p+-InGaAs),
wherein the electric heater is configured to apply heat to the active layer based on the enable voltage such that a temperature of the active layer is substantially stabilized during a period.

19. The laser system of claim 16, further comprising a gold (Au) layer atop a portion of the Pt layer, wherein the Au layer is configured to serve as a bonding pad.

20. An apparatus comprising:
a laser having an anode and configured to emit an optical signal during a burst period; and
a heater at least partially disposed over a top surface and both sidewalls of the anode, the heater thermally coupled to the laser and configured to apply heat to the laser,
wherein the heat is applied to the laser at or before a start of the burst period and then reduced during the burst period to substantially stabilize a temperature of the laser during the burst period.

21. The apparatus of claim 20, further comprising a driver circuit configured to supply an electric current to the heater, wherein the electric current causes the heater to generate the heat applied to the laser.

22. The apparatus of claim 20, wherein application of the heat to the laser at or before the burst period mitigates wavelength shift of the optical signal during the burst period.

23. The apparatus of claim 20, wherein an amount of the heat applied to the laser is reduced after the start of the burst period.

24. The apparatus of claim 20, wherein the heater is turned off before the burst period has ended.

25. The apparatus of claim 20, wherein the laser is disposed within a transmitter of an optical network unit (ONU).

26. The apparatus of claim 20, wherein the laser is disposed within a transmitter of an optical line termination (OLT).

* * * * *